United States Patent
Otsuka

(10) Patent No.: US 7,479,187 B2
(45) Date of Patent: Jan. 20, 2009

(54) METHOD FOR MANUFACTURING SILICON EPITAXIAL WAFER

(75) Inventor: Toru Otsuka, Nishishirakawa-gun (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 297 days.

(21) Appl. No.: 10/495,870

(22) PCT Filed: Aug. 19, 2003

(86) PCT No.: PCT/JP03/10455

§ 371 (c)(1),
(2), (4) Date: May 18, 2004

(87) PCT Pub. No.: WO2004/021421

PCT Pub. Date: Mar. 11, 2004

(65) Prior Publication Data

US 2005/0160971 A1 Jul. 28, 2005

(30) Foreign Application Priority Data

Aug. 28, 2002 (JP) ............................. 2002-248593

(51) Int. Cl.
*C30B 23/00* (2006.01)
(52) U.S. Cl. .................................................... 117/89
(58) Field of Classification Search .................. None
See application file for complete search history.

(56) References Cited

U.S. PATENT DOCUMENTS 6,589,868 B2 * 7/2003 Rossman .................... 438/680
6,951,220 B1 * 10/2005 Arasnia et al. ............. 134/22.1

FOREIGN PATENT DOCUMENTS

| JP | A 5-211123 | 8/1993 |
|----|------------|--------|
| JP | A 7-221022 | 8/1995 |
| JP | A 9-199424 | 7/1997 |
| JP | A 10-36191 | 2/1998 |
| JP | A 2001-135576 | 5/2001 |

* cited by examiner

*Primary Examiner*—Allan Olsen
(74) *Attorney, Agent, or Firm*—Oliff & Berridge, PLC

(57) ABSTRACT

A silicon epitaxial wafer manufacturing method, in which a vapor phase growth of a silicon epitaxial layer is performed on a front surface of a silicon single crystal substrate (W) arranged in the reaction chamber (12). A silicon deposit deposited in the reaction chamber (12) is removed by etching an inside of the reaction chamber (12) with a hydrogen chloride gas in a state that a silicon crystal substrate (W) is not introduced, and thereafter, a primary cooling is performed in the reaction chamber (12). Subsequently, a secondary cooling is performed after heating an inside of the reaction chamber (12), and thereafter, the vapor phase growth is performed to manufacture a silicon epitaxial wafer.

5 Claims, 4 Drawing Sheets

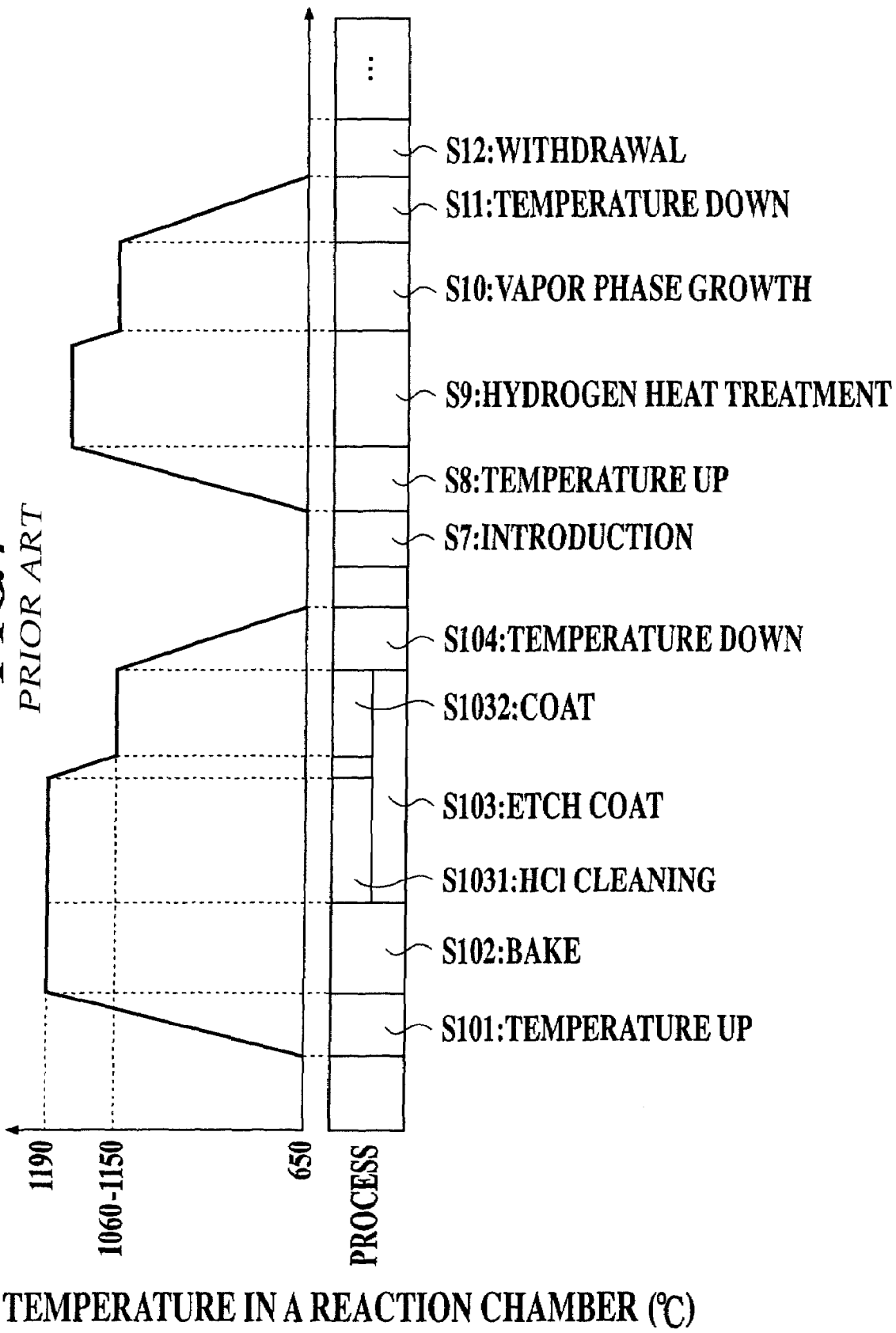

METHOD FOR MANUFACTURING SILICON EPITAXIAL WAFER

FIELD OF THE INVENTION

This invention relates to a silicon epitaxial wafer manufacturing method.

BACKGROUND ART

Recently, there is known a silicon epitaxial wafer manufacturing method in which vapor phase growth of a silicon epitaxial layer (hereinafter, sometimes referred as epitaxial layer) is performed on a front surface of a silicon single crystal substrate (hereinafter, sometimes referred as silicon substrate) to manufacture a silicon epitaxial wafer (hereinafter, sometimes referred as epitaxial wafer).

Such the epitaxial wafer manufacturing method is carried out by supplying silicon material gas onto the front surface of the silicon substrate while heating the silicon substrate arranged in a reaction chamber to perform a vapor phase growth of an epitaxial layer.

More specifically, an epitaxial wafer is manufactured by the following processes.

That is, for example as shown in FIG. 3, first, a silicon substrate is introduced into a reaction chamber which is set to an introduction temperature (for example, about 650° C.) (Step S7).

Next, temperature inside the reaction chamber is heated up (temperature up) to a hydrogen heat treatment temperature (for example, about 1100° C. to 1180° C.) (Step S8) to perform a hydrogen heat treatment, thereby etching an oxide film on a surface of the silicon substrate by hydrogen to remove it (Step S9).

Next, temperature inside the reaction chamber is set to a growth temperature (for example, about 1060° C. to 1150° C.), and silicon material gas (for example, trichlorosilane or the like) is supplied onto a front surface of the silicon substrate. Thereby, the vapor phase growth of an epitaxial layer is performed on the front surface of the silicon substrate to manufacture an epitaxial wafer (Step S10). The hydrogen heat treatment is, specifically, performed before the start of the vapor phase growth.

Next, temperature inside the reaction chamber is cooled down (temperature down) to a withdrawal temperature (for example about 650° C. same as the above described introduction temperature) (Step S11), and the epitaxial wafer is withdrawn from the inside of the reaction chamber (Step S12).

Epitaxial wafers can be manufactured in order by repeating the above described each process (Step S7 to Step S12).

Incidentally, repeating such the manufacturing of an epitaxial wafer would result in gradually depositing silicon deposit inside the reaction chamber, which could be a cause of particles or the like. Particles adhered to a surface of the silicon substrate would have an adverse effect on quality of an epitaxial wafer. Therefore, after repeating manufacture of epitaxial wafers for predetermined times, the etching is performed in the reaction chamber by hydrogen chloride (HCl) gas and a cleaning is performed (HCl cleaning), thereby removing silicon deposit.

That is, specifically, for example as shown in FIG. 4, first, the temperature in the reaction chamber is heated up (temperature up) from the above described withdrawal temperature to an HCl cleaning temperature (for example, about 1190° C.) without introducing a silicon substrate into the reaction chamber (Step S101). Next, a bake is performed (Step S102). Next, hydrogen chloride gas is introduced into the reaction chamber to perform the etching in the reaction chamber for cleaning (performing the HCl cleaning; Step S1031).

When the HCl cleaning is performed, silicon deposit is removed from each portion (susceptor, inside wall of the reaction chamber and the like) inside the reaction chamber, thereby exposing a bare surface of the each portion inside the reaction chamber. However, performing the vapor phase growth in the state that the bare surface of the each portion inside the reaction chamber is exposed would have an adverse effect on quality of an epitaxial wafer due to impurities diffused from the each portion inside the reaction chamber. Therefore, after the HCl cleaning, temperature inside the reaction chamber continues to be set to the growth temperature to introduce silicon material gas into the reaction chamber, thereby coating the surface of the each portion inside the reaction chamber with a silicon thin film (Step S1032). Thereafter, temperature inside the reaction chamber is cooled down to the above described introduction temperature (Step S104) to prepare for the next vapor phase growth. Performing the coating in this manner is successful in suppressing diffusion of impurities from the each portion inside the reaction chamber.

In the above description, the HCl cleaning (Step S1031) and the subsequent coat (Step S1032) are generically named as "etch coat".

After performing the etch coat (Step S103) or the like, the above described each process (Step S7 to Step S12) is successively repeated to sequentially manufacture an epitaxial wafer.

Incidentally, in a case of performing the vapor phase growth by using a silicon substrate which was subjected to a mirror polishing finished on a rear surface, tarnish is observed on a rear surface of a manufactured epitaxial wafer under light from a collimated light. Especially, such the tarnish is notably observed on an epitaxial wafer manufactured by the first vapor phase growth after the above described etch coat (Step S103 in FIG. 4), which was a cause to lower yield. To put it more concretely, the tarnish has a slight irregularity.

This invention has been accomplished for solving the above described problems, and an object of this invention is to provide a silicon epitaxial wafer manufacturing method capable of suppressing occurrence of tarnish on a rear surface of a manufactured epitaxial wafer even in a case of performing vapor phase growth by using a silicon single crystal substrate which was subjected to mirror polish finished on a rear surface.

DISCLOSURE OF THE INVENTION

In order to solve the above described problem, in accordance with a first aspect of this invention, a silicon epitaxial wafer manufacturing method in which a vapor phase growth of a silicon epitaxial layer is performed on a front surface of a silicon single crystal substrate while heating the silicon single crystal substrate introduced into a reaction chamber comprises: etching an inside of the reaction chamber with a hydrogen chloride gas to remove a silicon deposit deposited in the reaction chamber in a state that a silicon crystal substrate is not introduced in the reaction chamber; thereafter performing a primary cooling in the reaction chamber; subsequently performing a secondary cooling after heating an inside of the reaction chamber; and thereafter introducing a silicon single crystal substrate into the reaction chamber to perform the vapor phase growth.

Preferably, in the silicon epitaxial wafer manufacturing method of this invention, the silicon epitaxial wafer manufacturing method further comprises forming a silicon thin film in the reaction chamber by introducing a silicon material gas in the reaction chamber after the etching, which is followed by the primary cooling.

Preferably, a temperature in the reaction chamber is cooled down to a predetermined introduction temperature of a silicon single crystal substrate in the reaction chamber by the secondary cooling.

Preferably, the silicon epitaxial wafer manufacturing method of this invention is adapted in a case of performing a vapor phase growth by using a single wafer type vapor phase growth apparatus.

Preferably, the silicon epitaxial wafer manufacturing method of this invention is adapted in a case of using a silicon single crystal substrate which was subjected to a mirror polishing finished on a rear surface.

Preferably, the etching is performed after performing the vapor phase growth for predetermined times.

According to the silicon epitaxial wafer manufacturing method in this invention, occurrence of tarnish on a rear surface of a manufactured epitaxial wafer can be suppressed even in a case of performing a vapor phase growth by using a silicon substrate which was subjected to a mirror polishing finished on a rear surface.

BRIEF DESCRIPTION OF THE DRAWINGS

FIG. 4 is a flow chart for explaining a silicon epitaxial wafer manufacturing method of a related art.

BEST MODE FOR CARRYING OUT THE INVENTION

Hereinafter, embodiments according to this invention will be described with reference to the drawings.

Initially, a composition of a single wafer type vapor phase growth apparatus as a preferred example of a vapor phase growth apparatus used for the silicon epitaxial wafer manufacturing method of this embodiment will be explained.

Figure 2:
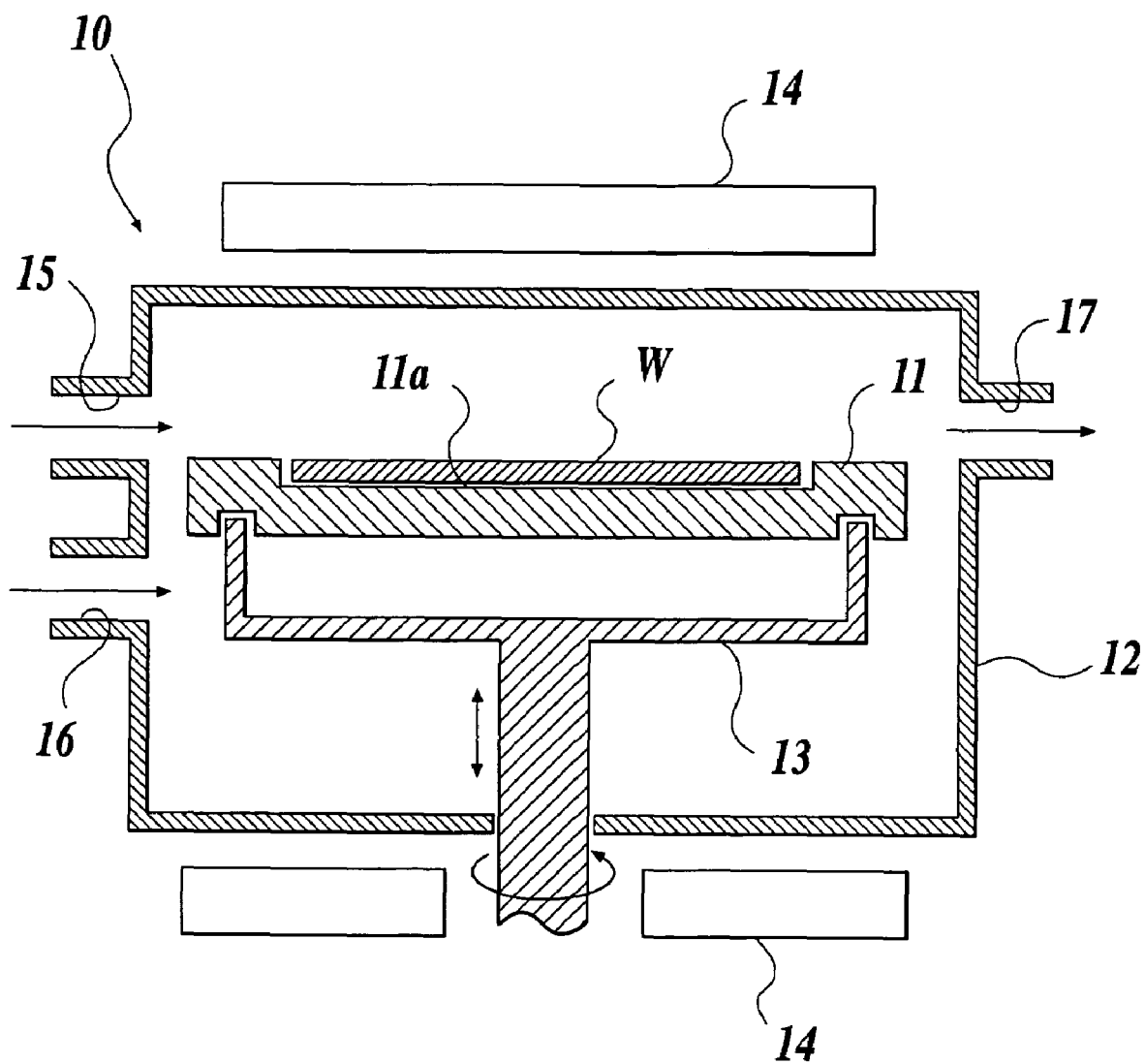
FIG. 2 is a front sectional view schematically showing a silicon epitaxial wafer manufacturing apparatus.

As shown in FIG. 2, a vapor phase growth apparatus 10 is schematically composed to comprise a disk shaped susceptor 11 for supporting a silicon substrate W while a vapor phase growth, a reaction chamber 12 for disposing the susceptor 11 inside thereof in an approximately parallel state, a susceptor support member 13 which is rotatably driven while supporting the susceptor 11 from a lower surface side, a heating apparatus 14 (specifically, for example a halogen lamp) for heating the inside of the reaction chamber 12, a gas introducing pipe 15 for introducing silicon material gas to a region above the susceptor 11 in the reaction chamber 12 to supply the gas onto a front surface of the silicon substrate W on the susceptor 11, a purge gas introducing pipe 16 provided on the same side of the gas introducing pipe 15 with respect to the reaction chamber 12, for introducing the purge gas to a region below the susceptor 11 in the reaction chamber 12, and a an exhaust pipe 17 provided on the opposite side of the reaction gas introducing pipe 15 and the purge gas introducing pipe 16 with respect to the reaction chamber 12, for exhausting gas from the reaction chamber 12. There is formed a pocket 11a on the upper surface of the susceptor 11 (concavity portion with a round shape in plain view, the inside of which the silicon substrate W can be placed) for placing the silicon substrate W.

An epitaxial wafer can be manufactured as follows by using the vapor phase growth apparatus 10.

Figure 3:
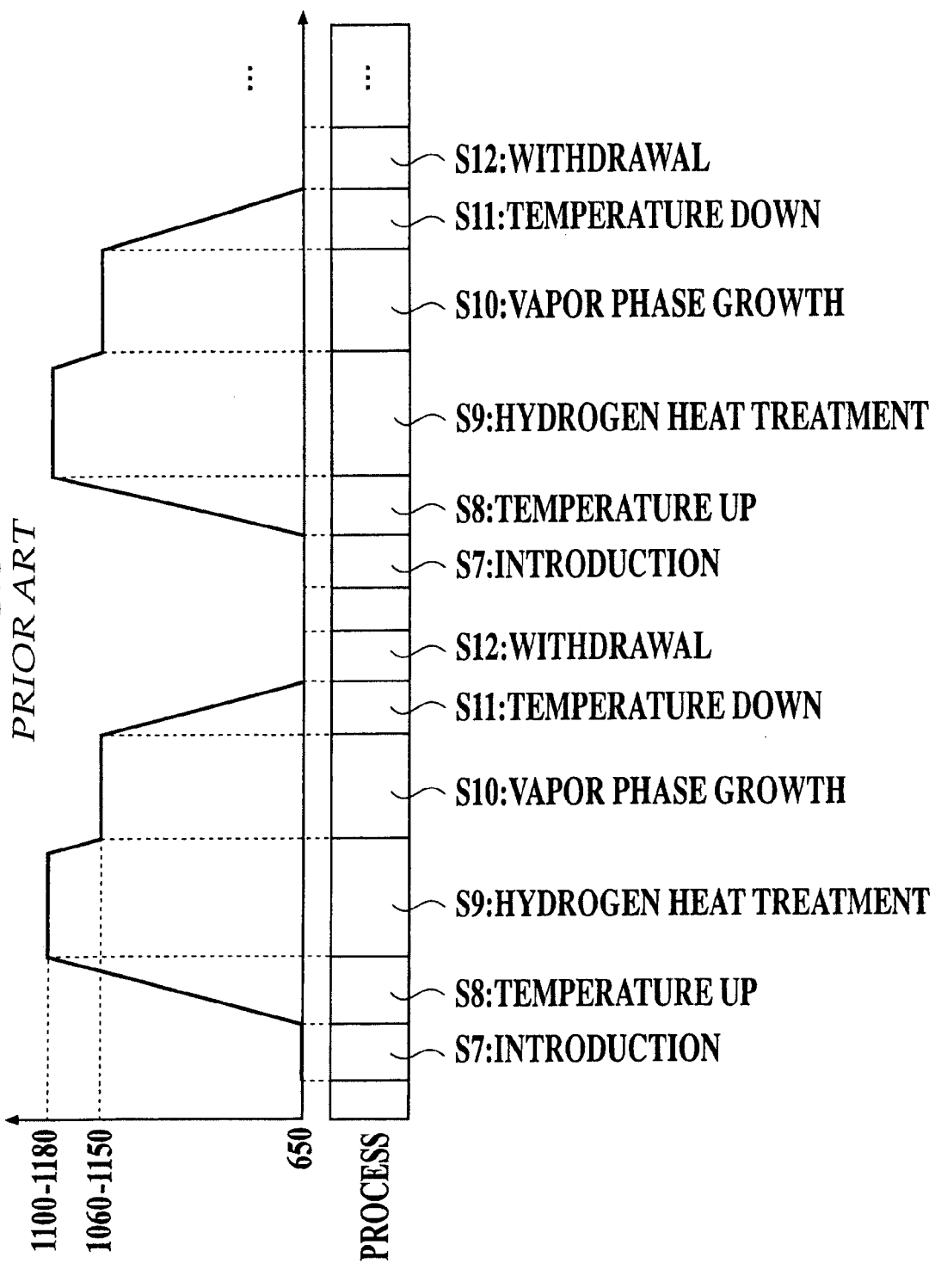
FIG. 3 is a flow chart for explaining a repeatedly performed silicon epitaxial wafer manufacturing.

That is, first, a silicon substrate W which was subjected to a mirror polishing finished on front and rear surfaces is introduced into the reaction chamber 12 which is set to be an introduction temperature (for example, about 650° C.), and the silicon substrate W is placed on the pocket 11a of the susceptor 11 with the front surface facing upward (Step S7 in FIG. 3).

Next, the temperature inside the reaction chamber 12 is heated up (temperature up) to a hydrogen heat treatment temperature (for example, about 1100° C. to 1180° C.) (Step S8 in FIG. 3), and performing a hydrogen heat treatment for etching an oxide film on a surface of the silicon substrate with hydrogen to remove it (Step S9 in FIG. 3).

Next, the temperature inside the reaction chamber 12 is set to a growth temperature (for example, about 1060° C. to 1150° C.), and then silicon material gas (for example, trichlorosilane or the like) introduced into the reaction chamber 12 through the gas introducing pipe 15 is supplied onto a front surface of the silicon substrate W.

Thereby, the vapor phase growth of an epitaxial layer is performed on the front surface of the silicon substrate W to manufacture an epitaxial wafer (Step S10 in FIG. 3).

Next, the temperature in the reaction chamber 12 is cooled down (temperature down) to a withdrawal temperature (for example, about 65020 C. same as the above described introducing temperature) (Step S11), and then the epitaxial wafer is withdrawn from the inside of the reaction chamber 12 (Step S12).

Epitaxial wafers are manufactured in order by repeating the above described each process (Step S7 to Step S12), however, repeating manufacturing the epitaxial wafer would result in gradually depositing silicon deposit inside the reaction chamber 12, which becomes a cause of occurrence of particles.

Therefore, after repeating manufacturing the epitaxial wafer for predetermined times which is more than one (for example, five times), an HCl cleaning is performed to remove silicon deposit in the reaction chamber 12.

That is, first, the temperature in the reaction chamber 12 before introducing the silicon substrate W is heated up (temperature up) from the above described withdrawal temperature to an HCl cleaning temperature (for example, about 1190° C.) (Step S1 in FIG. 1).

Next, a bake is performed to sufficiently heat up the temperature of a wall portion or the like of the reaction chamber 12 (Step S2). Performing the bake is successful in raising the efficiency of the etching in the HCl cleaning following the bake. The time of the bake is preferably adjusted according to the amount of silicon deposit deposited in the reaction chamber 12. That is, in a case that the amount of silicon deposit is large, the bake is performed longer, thereby sufficiently heating up the temperature of the wall portion or the like in the reaction chamber 12 so as to raise the efficiency of the etching in the HCl cleaning.

Next, hydrogen chloride gas (HCl) is introduced into the reaction chamber 12 to perform the etching in the reaction chamber 12, and the cleaning is performed (performing the HCl cleaning; Step 31).

By performing the HCl cleaning, silicon deposit is removed from each portion (susceptor 11, inside wall of the reaction chamber 12 and the like) inside the reaction chamber 12, thereby exposing a bare surface of the each portion inside the reaction chamber 12.

However, performing the vapor phase growth in the state that a bare surface of the each portion inside the reaction chamber 12 is exposed would have an adverse effect on quality of an epitaxial wafer due to impurities diffused from the each portion inside the reaction chamber 12.

Therefore, after the HCl cleaning, subsequently, the temperature inside the reaction chamber 12 is set to a growth temperature and silicon material gas is introduced into the reaction chamber 12, thereby coating a surface of the each portion inside the reaction chamber 12 with a silicon thin film (perform the coat; Step S32).

Thereafter, the temperature inside the reaction chamber 12 is cooled down to the above described introduction temperature (primary cooling; Step S4).

In the above description, the HCl cleaning (Step S31) and the coat (Step S32) following the HCl cleaning are generically named as "etch coat" (Step S3).

In this embodiment, after a primary cooling (Step S4) following the etch coat (Step S3), heating and cooling (Step S5, S6) in the reaction chamber 12 are performed as will be explained below before performing vapor phase growth.

That is, after the primary cooling (Step S4), first, the temperature in the reaction chamber 12 is heated up (temperature up) to, for example, about 1130° C. to 1180° C. (more specifically, for example about 1150° C.) (Step S5).

Next, the temperature is kept for a predetermined time (for example, keeping the temperature for 1 minute is enough).

Next, the temperature in the reaction chamber 12 is cooled down (temperature down) to, for example, 800° C. or below, and more specifically, for example about 650° C. (cooling; secondary cooling) (Step S6).

Thereafter, the above described each process (Step S7 to Step S12) is repeated to manufacture epitaxial wafers in order.

As described above, in this embodiment, an silicon epitaxial wafer is manufactured by etching the inside of the reaction chamber 12 with hydrogen chloride gas to remove silicon deposit deposited in the reaction chamber 12 in a state that the silicon substrate W is not introduced into the reaction chamber 12 (Step S31), thereafter performing the primary cooling inside the reaction chamber 12 (Step S4), subsequently performing the secondary cooling (Step S6) after heating the inside of the reaction chamber 12 (Step S5), thereafter introducing the silicon substrate W into the reaction chamber 12 (Step S7) and heating the inside of the reaction chamber 12 (Step S8), and performing the vapor phase growth (Step S10).

Consequently, occurrence of tarnish on a rear surface of a manufactured epitaxial wafer W can be suppressed even in a case of performing the vapor phase growth by using a silicon substrate W which was subjected to the mirror polishing finished on a rear surface. That is, specially, occurrence of tarnish on a rear surface of an epitaxial wafer manufactured by the first vapor phase growth after the HCl cleaning (Step S31) can preferably be suppressed.

Figure 1:
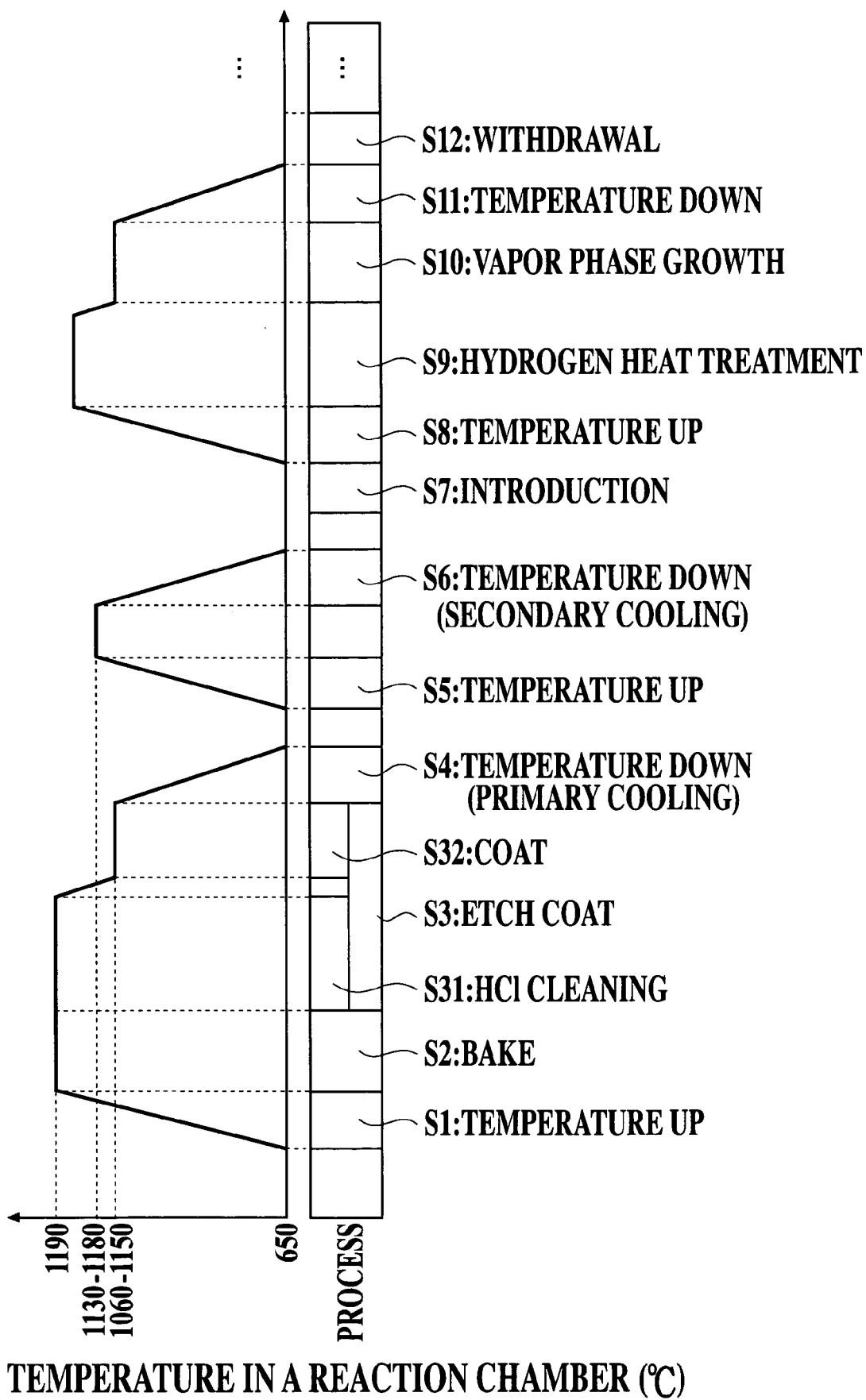
FIG. 1 is a flow chart for explaining a silicon epitaxial wafer manufacturing method in this invention.

As an earlier technique, when performing the first vapor phase growth (Step S10 in FIG. 4) without performing the heating up and cooling down of Step S5 to Step S6 in FIG. 1 after the etch coat (Step S103 in FIG. 4), tarnish is considered to be generated on a rear surface of an epitaxial wafer by the following reasons.

First, in the HCl cleaning (Step S1031 in FIG. 4), active HCl adsorbs on a surface of the susceptor or the like in the reaction chamber 12.

When heating for the vapor phase growth is performed (Step S8 and the like in FIG. 4) while placing a silicon substrate onto the susceptor with a front surface thereof facing upward (that is, the rear surface facing the susceptor side) in such the state that active HCl adsorbs on the surface of the susceptor, the active HCl etches the rear surface of the silicon substrate, thereby forming slight irregularities. The etched portion is extremely small, which can not be visually recognized.

Thereafter, when silicon material gas is introduced into the reaction chamber, the silicon material gas goes around even to the rear surface side of the silicon substrate to slightly grow a silicon thin film. When growing a silicon thin film, the preformed irregularities on the rear surface become large, causing tarnish.

The tarnish is well easily observed in the case that the rear surface was subjected to the mirror polishing finished rather than in the case that the rear surface was subjected to a chemical etching. That is, when performing the vapor phase growth by using a silicon single crystal substrate subjected to the mirror polishing finished on the rear surface, tarnish would notably observed.

Contrarily, as in this embodiment, when performing the heating up and cooling down of the temperature in the reaction chamber 12 as shown in Step S5 and Step S6 in FIG. 1, the susceptor 11 is also heated up and cooled down, so that active HCl is considered to be removed from the susceptor 11 before introducing the silicon substrate W.

That is, active HCl adsorbed on a surface of susceptor in the HCl cleaning (Step S31 in FIG. 1) is removed from the susceptor 11 by the subsequent heating up and cooling down (Step S5, Step S6).

Accordingly, thereafter, when performing the heating up (Step S8 or the like in FIG. 1) for vapor phase growth after placing the silicon substrate W onto the susceptor 11, it can be suppressed that the rear surface of the silicon substrate W is etched by HCl, that is, it can be suppressed that small irregularities are formed on the rear surface of the silicon substrate W.

Accordingly, even a slight silicon thin film is formed on the rear surface by silicon material gas which goes around to the rear surface side of the silicon substrate W in the subsequent vapor phase growth, occurrence of tarnish on the rear surface can be reduced.

According to this embodiment as described above, even in the case of performing the vapor phase growth by using a silicon substrate subjected to the mirror polishing finished on a rear surface, occurrence of tarnish on a rear surface of a manufactured epitaxial wafer can be suppressed.

In the above described embodiment, example was explained, in which the single wafer type vapor phase growth apparatus 10 is used to manufacture an epitaxial wafer, however, other types of vapor phase growth apparatuses (batch type, pancake type, barrel type or the like) are also applicable.

In the above embodiment, example was explained, in which the coat (Step 32 in FIG. 1) is performed after the HCl cleaning (Step S31 in FIG. 1), however, the coat can be omitted.

INDUSTRIAL APPLICATION

According to the silicon epitaxial wafer manufacturing method of this invention, occurrence of tarnish on a rear surface of a manufactured epitaxial wafer can be suppressed even in a case of performing a vapor phase growth by using a silicon substrate subjected to a mirror polishing finished on a rear surface. Thus, the silicon epitaxial wafer manufacturing method of this invention is particularly suitable for perform-

The invention claimed is:

1. A silicon epitaxial wafer manufacturing method in which a vapor phase growth of a silicon epitaxial layer is performed on a front surface of a silicon single crystal substrate which is subjected to a mirror polishing finished on a rear surface, while heating the silicon single crystal substrate introduced into a reaction chamber comprising:

etching an inside of the reaction chamber with a hydrogen chloride gas to remove a silicon deposit deposited in the reaction chamber in a state that a silicon single crystal substrate is not introduced in the reaction chamber;

thereafter performing a primary cooling in the reaction chamber;

subsequently performing a secondary heating of an inside of the reaction chamber;

subsequently performing a secondary cooling of the inside of the reaction chamber; and thereafter introducing a silicon single crystal substrate into the reaction chamber to perform the vapor phase growth; and forming a silicon thin film in the reaction chamber by introducing a silicon material gas in the reaction chamber after the etching, which is followed by the primary cooling, wherein the hydrogen chloride gas does not exist in the reaction chamber during both of the secondary heating and the secondary cooling.

2. The silicon epitaxial wafer manufacturing method as claimed in claim 1, wherein the vapor phase growth is performed by using a single wafer type vapor phase growth apparatus.

3. The silicon epitaxial wafer manufacturing method as claimed in claim 1, wherein a silicon single crystal substrate which was subjected to a mirror polishing finished on a rear surface is used.

4. The silicon epitaxial wafer manufacturing method as claimed in claim 1, wherein a temperature in the reaction chamber is cooled down to an introduction temperature of a silicon single crystal substrate by the secondary cooling.

5. The silicon epitaxial wafer manufacturing method as claimed in claim 4, wherein the vapor phase growth is performed by using a single wafer type vapor phase growth apparatus.

* * * * *